(12) United States Patent  (10) Patent No.: US 8,000,088 B2
Zhou et al.  (45) Date of Patent: *Aug. 16, 2011

(54) THIN ELECTRONIC DEVICE

(75) Inventors: Jia-Gui Zhou, Shenzhen (CN);
Cheng-Hao Chou, Taipei Hsien (TW);
Qiu-Chun Zhao, Shenzhen (CN);
Ming-Tesung Cheng, Taipei Hsien (TW); Kuan-Hong Hsieh, Taipei Hsien (TW); Han-Che Wang, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 65 days.

This patent is subject to a terminal disclaimer.

(21) Appl. No.: 12/542,651

(22) Filed: Aug. 17, 2009

(65) Prior Publication Data
US 2010/0226105 A1 Sep. 9, 2010

(30) Foreign Application Priority Data
Mar. 6, 2009 (CN) .......................... 2009 1 0300732

(51) Int. Cl.
*G06F 1/16* (2006.01)

(52) U.S. Cl. ...................... 361/679.01; 361/752; 349/58

(58) Field of Classification Search ............. 361/679.01, 361/752; 348/836, 58; 349/58
See application file for complete search history.

(56) References Cited

U.S. PATENT DOCUMENTS

| | | | |
|---|---|---|---|
| 7,466,540 B2 * | 12/2008 | Takahashi et al. | 361/679.27 |
| 7,522,230 B2 * | 4/2009 | Lee | 349/58 |
| 7,576,975 B2 * | 8/2009 | Tai et al. | 361/679.21 |
| 7,701,530 B2 * | 4/2010 | Lee | 349/58 |
| 7,733,642 B2 * | 6/2010 | Liou et al. | 361/679.41 |
| 2004/0042160 A1 * | 3/2004 | Yang et al. | 361/681 |
| 2006/0077629 A1 * | 4/2006 | Shiraishi | 361/681 |
| 2007/0079537 A1 * | 4/2007 | Lee | 40/750 |
| 2007/0109462 A1 * | 5/2007 | Lee et al. | 349/58 |
| 2007/0121036 A1 * | 5/2007 | Moon et al. | 349/113 |
| 2007/0247793 A1 * | 10/2007 | Carnevali | 361/681 |
| 2008/0123269 A1 * | 5/2008 | Tsai et al. | 361/681 |
| 2008/0291647 A1 * | 11/2008 | Hirota et al. | 361/752 |
| 2009/0147155 A1 * | 6/2009 | Hsu et al. | 348/836 |
| 2010/0020260 A1 * | 1/2010 | Hsu et al. | 349/58 |

FOREIGN PATENT DOCUMENTS

| | | |
|---|---|---|
| CN | 1579091 A | 2/2005 |
| CN | 201035274 Y | 3/2008 |

* cited by examiner

*Primary Examiner* — Lisa Lea-Edmonds
(74) *Attorney, Agent, or Firm* — Zhigang Ma

(57) ABSTRACT

An electronic device includes a housing, a display, and a printed circuit board. The housing receives the display unit and the printed circuit board. The printed circuit board surrounds a periphery of the display unit. The electronic device has a thin thickness.

7 Claims, 3 Drawing Sheets

THIN ELECTRONIC DEVICE

BACKGROUND

1. Technical Field

The present disclosure relates to a consumer electronic device.

2. Description of Related Art

There is a trend of thin design for the consumer electronic devices, such as digital photo frames, liquid crystal televisions (LCD TVs). Thin electronic devices can be used in limited space, and the appearance of thin electronic devices is more attractive to users.

An thin electronic device is disclosed.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
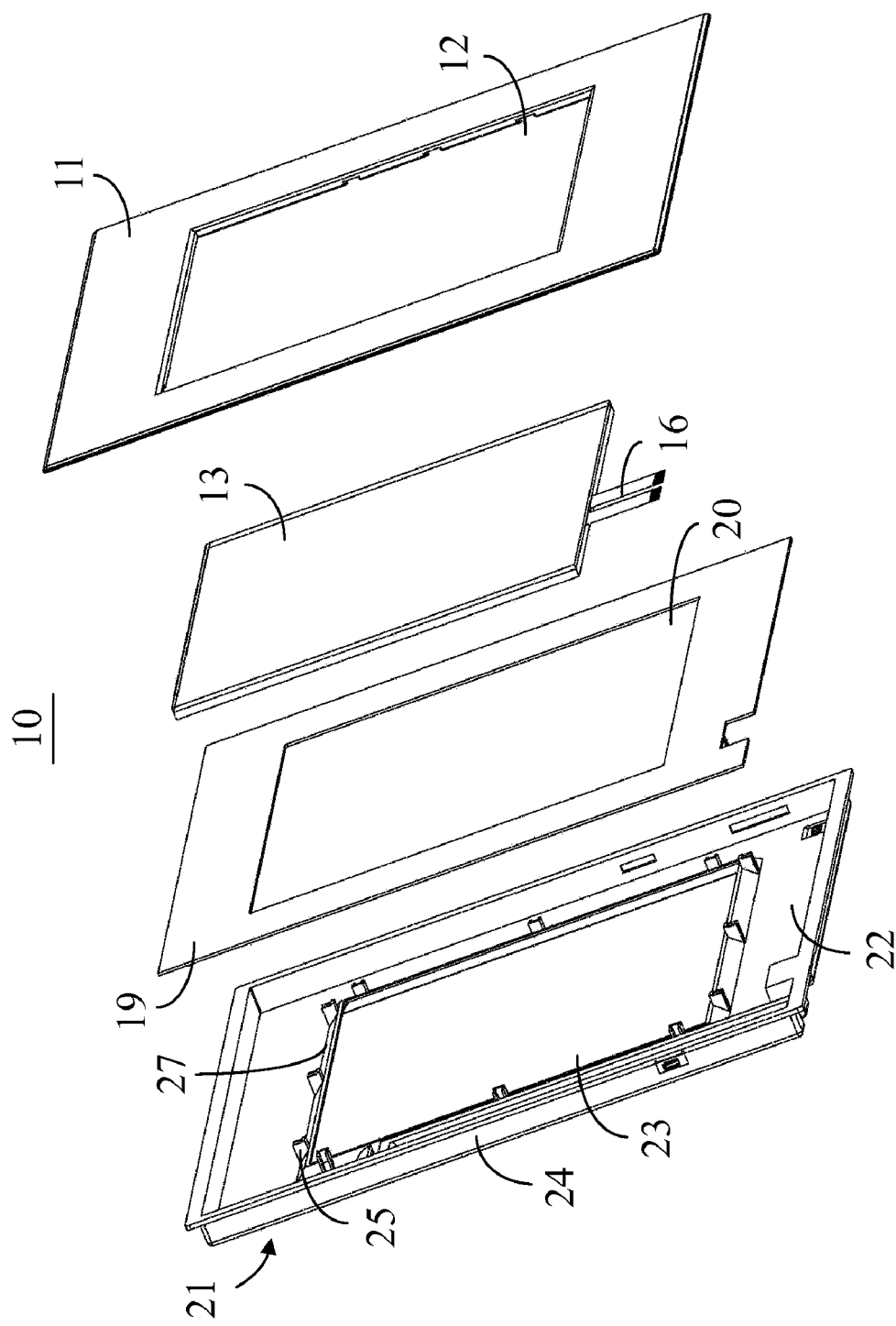
FIG. 1 is a schematic, exploded view of an electronic device according to an exemplary embodiment.

Referring to FIG. 1, an electronic device 10 according to an exemplary embodiment is disclosed. The electronic device 10 can be a digital photo frame, a PDA, a LCD TV, or the like. The electronic device 10 includes a house including a front cover 11 and a back cover 21 coupled to the front cover 11. The house receives a display unit 13 and a printed circuit board (PCB) 19. The PCB 19 surrounds the display unit 13. In this embodiment, the PCB 19 is rectangular and defines an opening 20 therein. The display unit 13 is received in the opening 20. In another embodiment, the PCB 19 can either be L shaped or U shaped.

The back cover 21 includes a bottom 22 and an outer wall 24 extending upwardly from a periphery of the bottom 22. The bottom 22 defines an opening 23. The back cover 21 further includes an inner wall 27 extending upwardly from the bottom 22 and surrounding a periphery of the opening 23. The inner wall 27 is lower than the outer wall 24. A plurality of limit pins 25 extends from the bottom 22 adjacent to the inner wall 27. The limit pins 25 are higher than the inner wall 27.

The front cover 11 defines an opening 12 which makes the display unit 13 visible to users.

Figure 2:
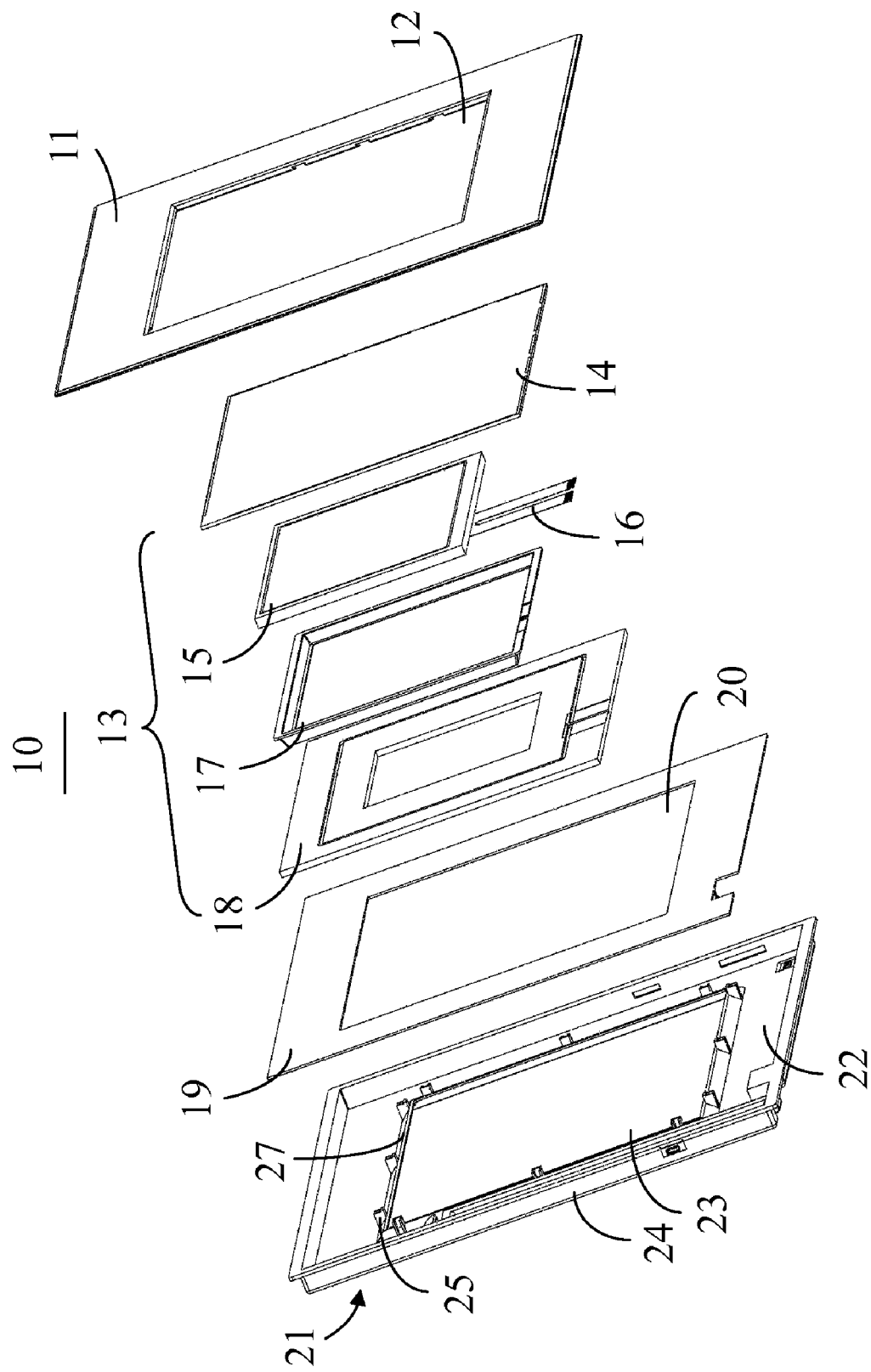
FIG. 2 is a schematic, further exploded view of the electronic device of FIG 1.

Referring to FIG. 2, in this embodiment, the display unit 13 includes a transparent board 14, a display panel 15, a display cover 17 and a transparent frame 18. The transparent board 14 and the transparent frame 18 are slightly larger than the opening 12, 23 of the front cover 11 and the back cover 21. The display panel 15 includes a transparent cable 16 configured for connecting the display panel 15 to the PCB 19. The display cover 17 receives the display panel 15. The transparent board 14 keeps the display panel 15 in the display cover 17. The transparent frame 18 is secured over the display cover 17. The display panel 15, the display cover 17, and the transparent frame 18 can be assembled by appropriate means, such as gluing or screwing. In another embodiment, the display unit 13 only includes the display panel 15 for getting a thinner thickness.

In assembly, firstly, putting the back cover 21 on a desk with the outer wall 24 and the inner wall 27 facing upwards and laying the PCB 19 on the bottom 22 between the outer wall 24 and the inner wall 27. Secondly, putting the display unit 13 on the inner wall 27 and securing the display unit 13 among the limit pins 25. Thirdly, connecting the transparent cable 16 to the PCB 19. At last, assembling the front cover 11 and the back cover 21 by appropriate means, such as screwing. In this way, the electronic device 10 is assembled together. As the PCB 19 is designed to surround the display unit 13, the electronic device 10 is thinner than a conventional electronic device in which the PCB is positioned behind the display unit.

The PCB 19 and the display unit 13 can also be mounted in the housing by other connecting means, such as screwing.

Figure 3:
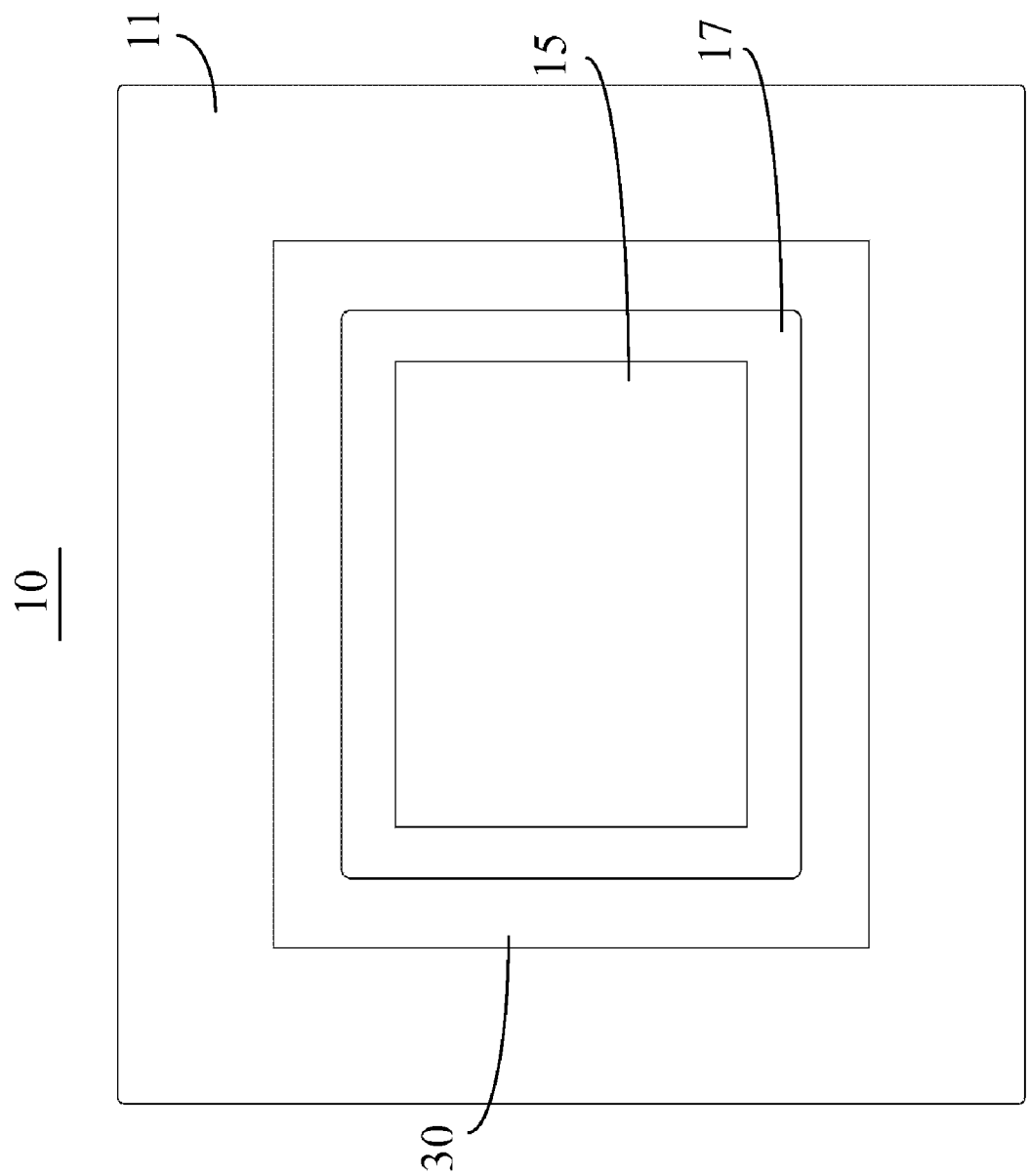
FIG. 3 is a schematic, front view of the electronic device of FIG. 1, showing the appearance of the electronic device.

Referring to FIG. 3, the electronic device 10 includes a transparent area 30 formed by the cooperation of the openings 12, 23, the transparent board 14, and the transparent frame 18. The transparent area 30 is positioned between the front cover 11 and the display cover 17. Thus, it looks like that the display unit 13 is floating in the air.

Moreover, it is to be understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A thin electronic device comprising:
   a housing comprising a front cover and a back cover coupled to the front cover;
   a display unit; and
   a printed circuit board received in the housing;
   wherein the front cover and the back cover respectively define openings, the display unit is received in the openings, the printed circuit board surrounds the display unit.

2. The thin electronic device of claim 1, wherein the printed circuit board defines an opening having a size larger than the display unit.

3. The thin electronic device of claim 1, wherein the display unit comprises a display panel, a display cover for receiving the display panel, a transparent board for securing the display panel in the display cover, and a transparent frame placed over the display cover, wherein the transparent board and the transparent frame each has a size slightly larger than the openings of the front cover and the back cover, and the display cover has a size smaller than the openings of the front cover and the back cover.

4. The thin electronic device of claim 3, further comprising a transparent cable for connecting the display panel to the printed circuit board.

5. The thin electronic device of claim 1, wherein the back cover comprises a bottom and an outer wall extending from a periphery of the bottom, the opening of the back cover is defined in the bottom, and the back cover further comprises an inner wall extending surrounding a periphery of the opening of the back cover.

6. The thin electronic device of claim 5, wherein the printed circuit board is positioned between the outer wall and the inner wall.

7. The thin electronic device of claim 5, further comprising limit pins extending adjacent the inner wall for securing the display unit on the back cover.

* * * * *